United States Patent
Harris et al.

(10) Patent No.: US 7,360,104 B2
(45) Date of Patent: Apr. 15, 2008

(54) REDUNDANT VOLTAGE DISTRIBUTION SYSTEM AND METHOD FOR A MEMORY MODULE HAVING MULTIPLE EXTERNAL VOLTAGES

(75) Inventors: Shaun L. Harris, McKinney, TX (US); Gary Williams, Rowlett, TX (US); Eric C. Peterson, McKinney, TX (US); Jeffrey Allan Oberski, Lucas, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 433 days.

(21) Appl. No.: 11/047,304

(22) Filed: Jan. 31, 2005

(65) Prior Publication Data

US 2006/0174140 A1   Aug. 3, 2006

(51) Int. Cl.
   *G06F 1/26* (2006.01)
(52) U.S. Cl. ........................ 713/300; 365/226
(58) Field of Classification Search ............... 365/226; 713/300
   See application file for complete search history.

(56) References Cited

U.S. PATENT DOCUMENTS 5,563,838 A * 10/1996 Mart et al. ................. 365/226
6,798,709 B2 * 9/2004 Sim et al. ................... 365/226
2006/0083043 A1 * 4/2006 Cypher ......................... 365/51

OTHER PUBLICATIONS

Ronat; "3-Phase Synchronous PWM Controller IC Provides an Integrated Solution for Intel VRM 9.0 Design Guidelines"; International Rectifier; pp. 1-5.
Parto; "Dual Synchronous PWM Controller and LDO Controller in TSSOP Package Eases Multi-Output and Two-Phase Power Sypply Solutions"; International Rectifier; pp. 1-5.
Sewell; "New DDR2 Memory Offers Advantages for Dual-Processor Servers"; Technology @ Intel Magazine; http://ww.intel.com/update/contents/st09042.htm; pp. 1-6.
"Double Data Rate SDRAM: Fast Performance at an Economical Price"; Compaq Technology Brief; Jun. 2002; pp. 1-9.
"DDR2 DRAMs Fast Made Faster"; Infineon Technolgoies; Product Information; www.infineon.com/memory/DDR2; 2004; pp. 1-12.
Vogt; "Fully Buffered DIMM (FB-DIMM) Server Memory Architecture: Capacity, Performance, Reliability, and Longevity"; Intel Corporation; Feb. 18, 2004; pp. 1-33.
"DDR2 Advantages for Dual Processory Servers"; Intel Coporation; Aug. 2004; 8 pages.
Vogt et al.; "FB-DIMM Webcast"; Intel Corporation; Aug. 26, 2004; pp. 1-30.

* cited by examiner

*Primary Examiner*—Chun Cao
*Assistant Examiner*—Albert Wang

(57) ABSTRACT

A memory assembly module including an on-board voltage regulator for converting an externally supplied voltage into appropriate local voltage levels for powering memory devices of the memory assembly module.

35 Claims, 5 Drawing Sheets

REDUNDANT VOLTAGE DISTRIBUTION SYSTEM AND METHOD FOR A MEMORY MODULE HAVING MULTIPLE EXTERNAL VOLTAGES

BACKGROUND

One of the main reasons for the rapid change and growth in information technology (IT) power requirements is the increase in volume of data processed, stored, transmitted, and displayed. As a result, power requirements have grown very rapidly over the last few years. To control the increase in power dissipation due to increased frequency and gate count, operating voltages have been reduced, since power scales linearly with respect to voltage but scales as the square of the frequency. Therefore, the increasing frequency demand forces the voltages down proportionally in order to maintain a reasonable level of power dissipation. Today, feeding this large amount of "ultraclean" current at low voltages with huge transient response capability is the key technology driver of power management for IT.

Such power supply concerns assume particular significance in advanced memory designs currently being implemented. Additionally, rising bus and processing speeds are also demanding newer memory architectures that deliver improved performance by increasing clock frequencies and available bandwidth without pushing up power consumption. To cope with power requirements, industry standard memory modules, e.g., Dual In-line Memory Modules (DIMMS) populated with dynamic random access memory (DRAM) devices, are provided with power supply rails (on a relatively large number of pins) that are powered from system board or main board voltage sources, and are specific to the memory technology. As the performance of the DRAM technology goes up, and timing margins shrink, it is becoming increasingly more difficult for the system board sources to provide tightly regulated power for the DRAM cores as well as input/output (I/O) interface buffers. Furthermore, each generation of DIMM/DRAM technology requires a different power supply which keeps getting lower (e.g., 3.3V, 2.5V, 1.8V, 1.5V and beyond), thereby making it difficult to mix memory technologies on a system board, or provide upgrades to next generation DRAM technology in a cost-effective manner. One skilled in the art will recognize, in addition, that these issues are particularly significant for systems that are deployed in infrastructure with an expected product life of over five years or so since it is difficult to accurately design a system that will be optimized over such a long life span.

SUMMARY

One embodiment is directed to a voltage distribution system for a memory board assembly, comprising: means for supplying a voltage to the memory board assembly from an external source; and means for locally converting the voltage by an on-board voltage regulator module to generate appropriate local voltage levels for powering a plurality of memory devices of the memory board assembly.

DETAILED DESCRIPTION OF THE DRAWINGS

Figure 1A:
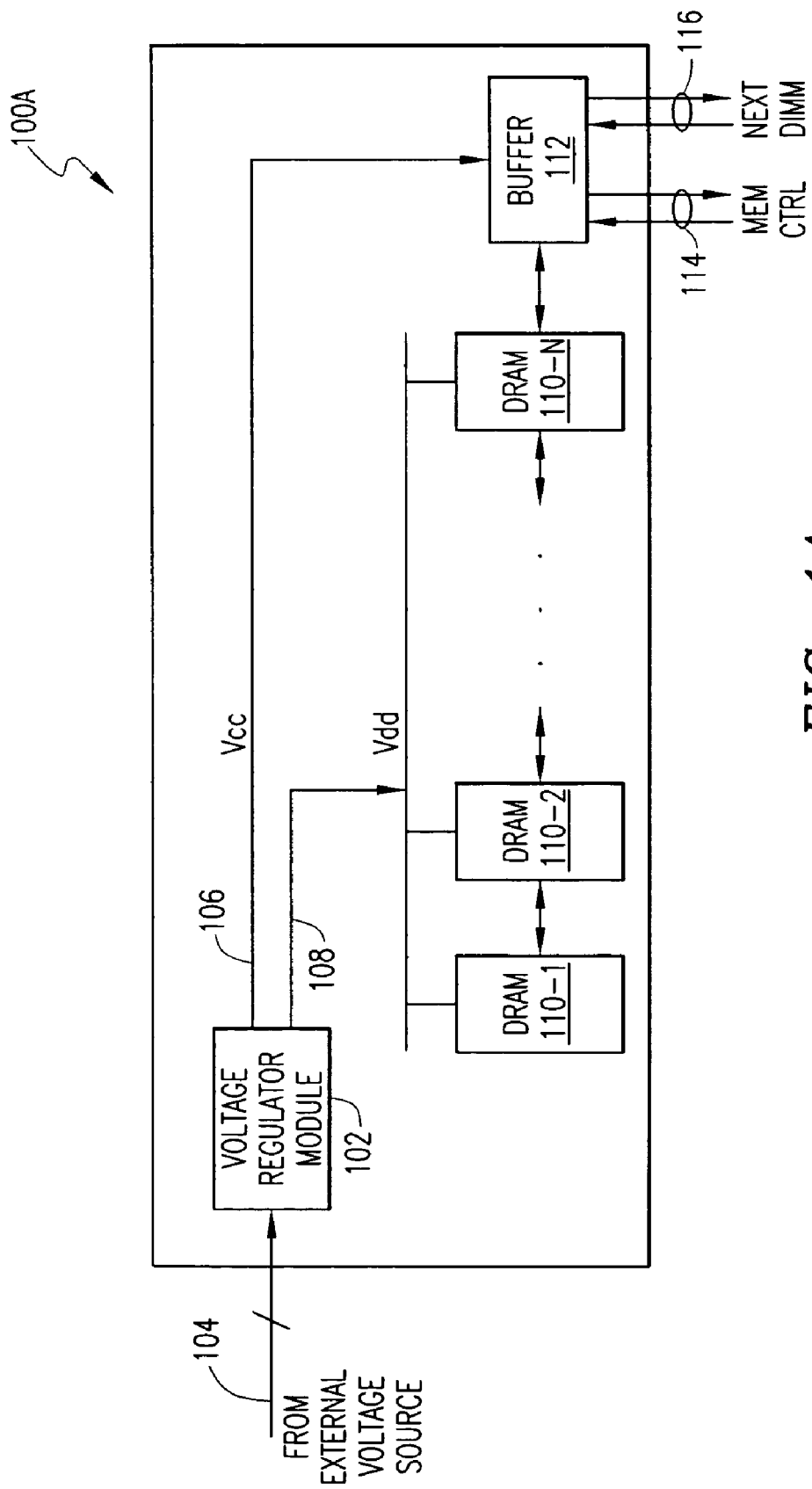
FIG. 1A is a block diagram of a voltage distribution system for a memory module according to one embodiment.

In the drawings, like or similar elements are designated with identical reference numerals throughout the several views thereof, and the various elements depicted are not necessarily drawn to scale. Referring now in particular to FIG. 1A, depicted therein is a block diagram of a voltage distribution system for a memory module 100A according to one embodiment. At the outset, those skilled in the art should appreciate that although the voltage distribution system is exemplified with respect to memory module 100A which may be embodied as a memory board assembly operable in a computer system, the teachings of the present patent disclosure may be implemented in any electronic system as will be set forth in detail hereinbelow. One or more memory devices 110-1 through 110-N are provided as part of the memory module 100A, each receiving a first voltage path 108, typically referred to as a $V_{dd}$ path, that may be energized to appropriate voltage levels depending on the type, functionality, and design of the memory devices, e.g., from about 0.5V to 3.5V or more. In one configuration, the memory module 100A may be implemented as a Dual In-line Memory Module (DIMM) wherein each of the memory devices 110-1 through 110-N comprises a Double Data Rate (DDR) dynamic random access memory (DRAM) device having a particular density, e.g., 256 Mb, 512 Mb, 1 Gb or 2 Gb, etc. Also, the memory devices can be of any known or heretofore unknown DDR type, e.g., DDR2 (operable with 1.8 V), DDR3 (operable with 1.35V to 1.5V), and the like. Further, the DIMM configuration of an exemplary memory module may include unbuffered DIMMs, registered DIMMs (RDIMMs), or fully buffered DIMMs (FBDs), and may be configured as having one or more ranks (e.g., 2, 4, 8, or more). In the illustrated embodiment of FIG. 1A, for instance, the DIMM configuration of the memory module 100A is exemplified as a fully buffered DIMM wherein a buffer/logic component 112 is provided for buffering command/address (C/A) space as well as data space at least for a portion of the memory devices 110-1 through 110-N. A bidirectional memory controller interface path 114 as well as a second voltage path 106, typically referred to as a $V_{cc}$ path, are provided with respect to the buffer component 112, wherein the $V_{cc}$ path may be energized to appropriate voltage levels depending on the buffer and DIMM technology, e.g., from about 0.5V to 3.5V or more. In addition, where multiple memory assemblies are daisy-chained on a single memory controller channel, a suitable daisy-chain interface 116 is provided for coupling the buffer component 112 to a next memory module.

In accordance with the teachings of the present patent disclosure, at least one on-board voltage regulator module (VRM) is provided as part of the memory board assembly module 100A for converting an externally supplied voltage level available on external source path 104 into appropriate local voltage levels that power the first and second voltage paths, i.e., the $V_{dd}$ and $V_{cc}$ paths 108, 106, respectively. Preferably, a high-frequency switching voltage converter capable of generating tightly-controlled voltage levels may be implemented as the on-board VRM 102 for purposes of the present patent disclosure. For instance, multi-phase synchronous Pulse-Width Modulated (PWM) controllers, Low Drop-Out (LDO) controllers, et cetera, that are capable of accepting unregulated supply voltages in a broad range may be configured to operate as a local voltage supply for the memory module 100A.

Those skilled in the art should recognize upon reference hereto that by providing a tightly-controlled VRM as local voltage supply for on-board power requirements, a number of advantages may be obtained in the power supply design of an electronic component such as the memory module 100A. Since the $V_{dd}$ and $V_{cc}$ power supply rails are rendered independent from external voltage sources, the overall power supply interface to the memory module 100A is improved to better support large memory capacity scaling, hot-pluggability, DRAM technology independence (e.g., DDR2, DDR3, DDR4, and other DRAM types), high DRAM device count (i.e., amenable to multi-ranking), as well as provide improved system-level cost sharing. Additionally, memory performance is also improved because of tighter voltage regulation.

By way of example, a standard FBD module requires 28 $V_{dd}$ pins (for DRAM devices) and 8 $V_{cc}$ pins (for buffer and logic) and associated Ground returns, resulting in a total of 72 pins that provide a power supply interface for up to two ×4 DRAM ranks (36 devices) and buffer logic. A voltage-independent FBD design incorporating the embodiment of FIG. 1A is capable of replacing these power supply interface pins with as few as six +12V pins (from an external voltage source), with local conversion to $V_{dd}$ (to DRAM) and $V_{cc}$ (to buffer/logic) being added. Alternatively, using additional power supply pins would provide the capability to support even more devices. For instance, with 12 supply pins (at +12V), the embodiment of FIG. 1A can provide enough power to supply 4 ranks (i.e., 72 devices). Likewise, a memory assembly of 8 ranks (144 devices) may be powered with 24 pins at +12V.

It is contemplated that local supply voltage conversion for double-rank DIMMs can be accommodated with a form factor design of approximately about one square inch (both sides of the printed circuit board), and at a component height compatible with applicable Joint Electron Device Engineering Council (JEDEC) standards. Further, since the +12V power supply is not used directly by DRAM devices or buffer/logic components of the memory assembly, a wide tolerance (e.g., around +/−15%) can be accommodated, allowing low cost power distribution for system boards (such as, e.g., motherboards, cell boards, et cetera) wherein design requirements for bypass/hold-up capacitors may be relaxed or minimized. By way of an additional variation in implementation, the form factor associated with the memory assembly module 100A may be suitably modified (e.g., removing the board's connector keyway) so as to ensure that a memory assembly module embodying the teachings of the present disclosure is not interchangeable with the standard DIMM, thereby preventing any accidental damage.

Figure 1B:
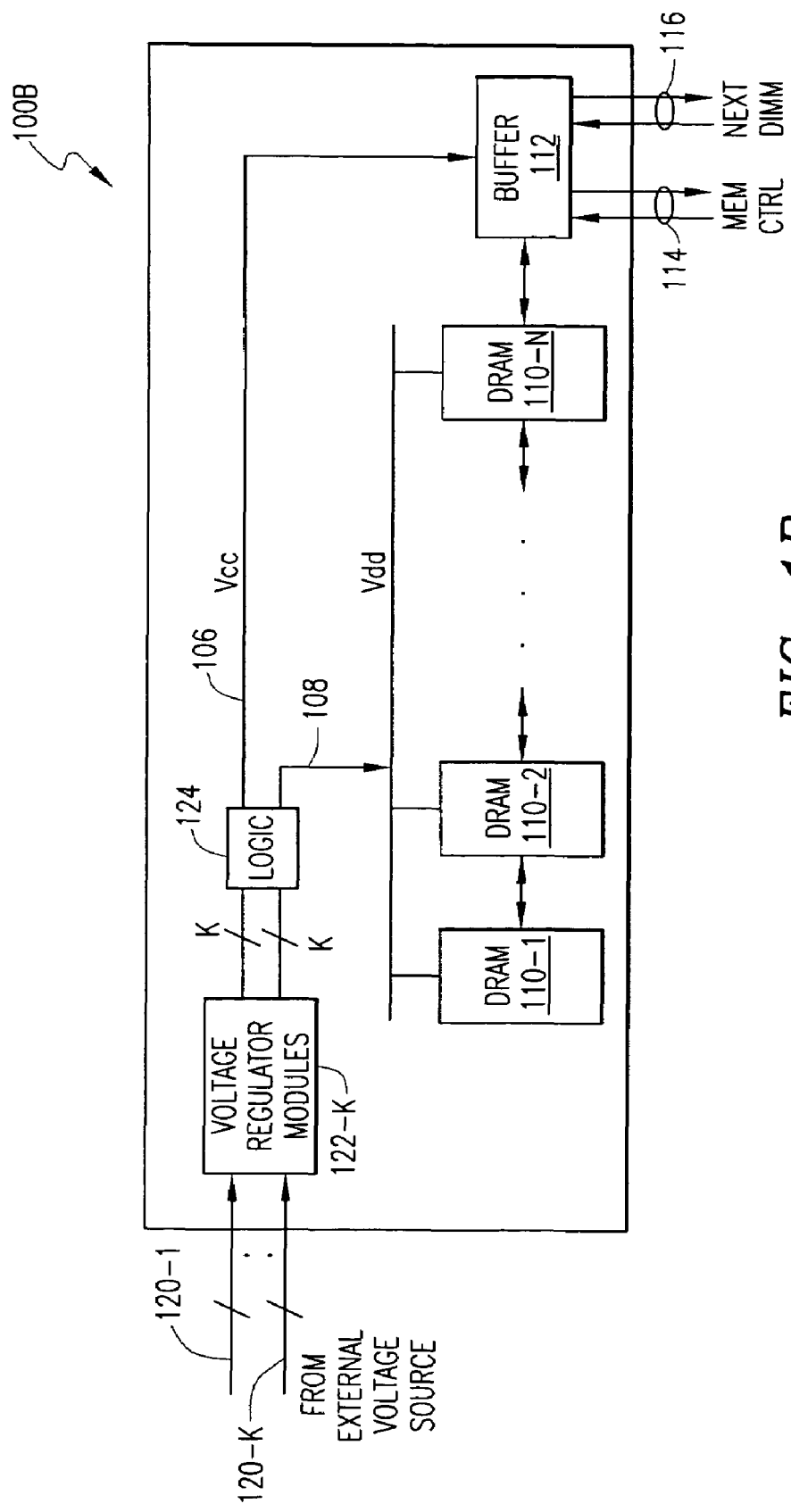
FIG. 1B is a block diagram of a voltage distribution system for a memory module according to another embodiment.

FIG. 1B is a block diagram of voltage distribution system for a memory module 100B according to another embodiment. It should be apparent to one skilled in the art that the voltage distribution system for memory module 100B is essentially similar to the system shown in FIG. 1A, but for the redundancy implementation of local voltage conversion. A plurality of on-board VRMs 122-K, K=1, 2, ..., N, are provided as part of the memory assembly/module 100B wherein each VRM is operable with an independent voltage supply path for locally converting an external supply voltage into appropriate local voltage levels. Reference numerals 120-1 through 120-K refer to K supply voltage paths which may be coupled to various voltage sources provided within the electronic system (e.g., a computer system) (not shown). It should be readily recognized that the external voltage sources may comprise any combination of known or heretofore unknown voltage supplies, either regulated or unregulated, and even including variable voltages.

A suitable logic module 124 is provided for selecting among the plurality of like voltage outputs from the VRMs 122-K in order to energize the $V_{dd}$ and $V_{cc}$ paths 108, 106, respectively. In one implementation, a wired-OR arrangement is operable to select from K voltage outputs (e.g., from K $V_{dd}$ outputs or from K $V_{cc}$ outputs) to power the appropriate local voltage supply path, i.e., the $V_{dd}$ and $V_{cc}$ paths. As described previously, the $V_{dd}$ path 108 is coupled to each of the DRAM devices 110-1 through 110-N and the $V_{cc}$ path 106 is coupled to the buffer/logic component 112 of the memory assembly module 100B.

Figure 2:
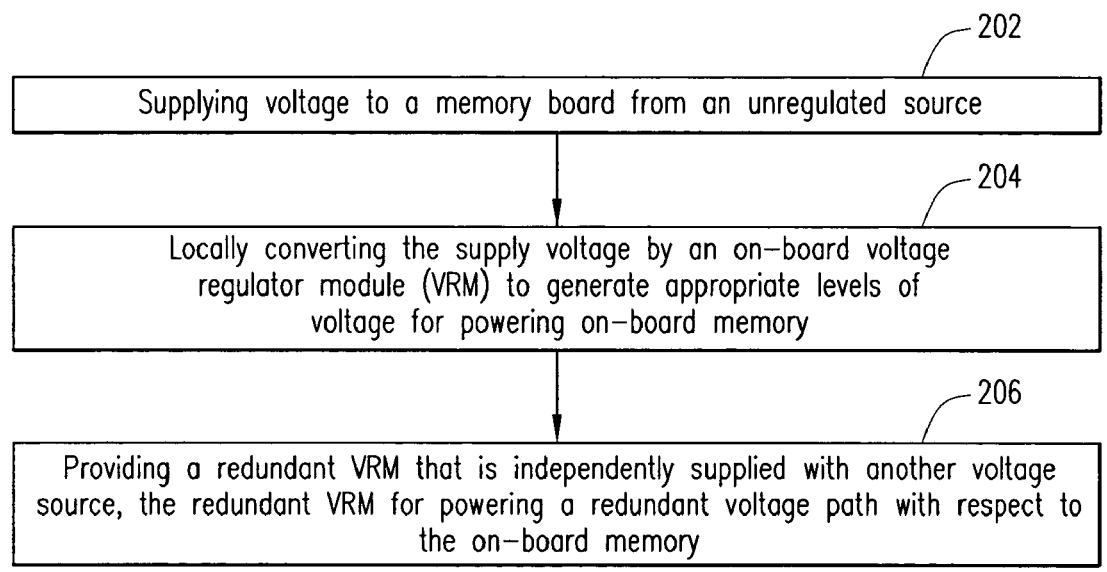
FIG. 2 is a flowchart of a voltage distribution method for a memory module according to one embodiment.

FIG. 2 is a flowchart of a voltage distribution method for a memory module according to one embodiment. As set forth at block 202, voltage is supplied to a memory board assembly from an external source, e.g., an unregulated source generating fairly high voltages (illustratively, at +12V) with a wide tolerance. The voltage distribution method then involves locally converting the supply voltage using an on-board VRM to generate appropriate levels of voltage for powering on-board memory devices. As pointed out earlier, the local voltage levels preferably depend on the application, e.g., DRAM type and technology. Optionally, a redundant VRM may be provided as part of the voltage distribution methodology, wherein the redundant VRM is operable to power a redundant voltage path with respect to the on-board memory devices and associated buffer/logic components (block 206).

Figure 3:
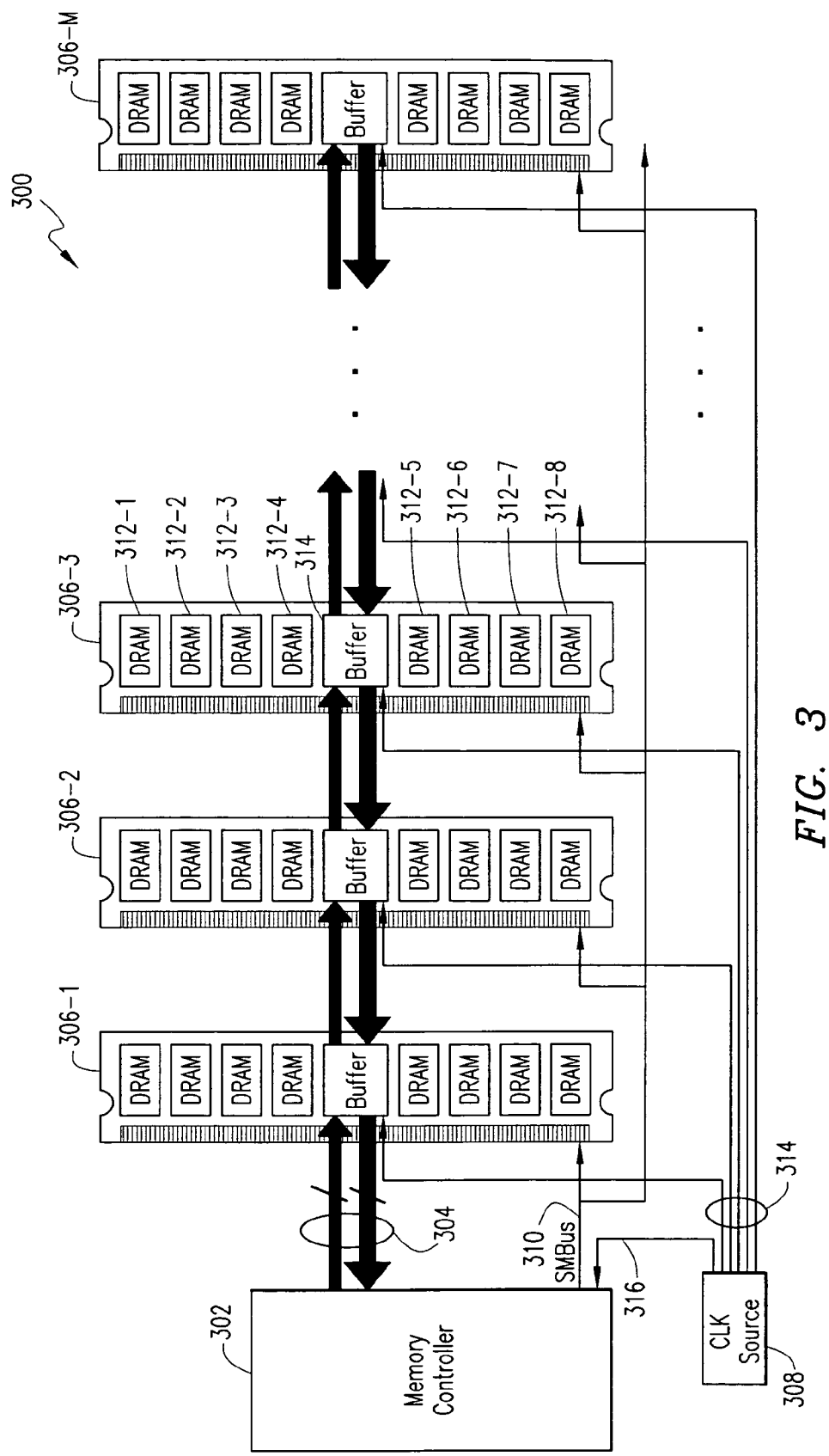
FIG. 3 is a block diagram of an exemplary memory assembly according to one embodiment.

FIG. 3 is a block diagram of an exemplary memory assembly 300 according to one embodiment. A memory controller 302 is operable to drive a bidirectional memory link 304 to which a plurality of memory boards 306-1 through 306-M are coupled in a daisy-chain fashion at their respective buffers. As exemplified by the memory board 306-3, each memory board includes eight DRAM devices 312-1 through 312-8, with a buffer component 314. A clock source 308 is operable to drive a plurality of clock signals to the memory boards via a clock bus 314. Additionally, the clock source 308 is also operable to drive a clock signal 316 to the memory controller 302 for providing a time base with respect to its operations. A system management bus (SM bus) 310 coupled to the memory boards 306-1 through 306-M is driven by the memory controller 302. Although not explicitly shown in this FIGURE, each memory board also receives a supply voltage that is locally converted by an on-board VRM for powering the DRAM and buffer components therein. In one arrangement, the supply voltage may be sourced from the memory controller 302 or from a separate voltage source.

Figure 4:
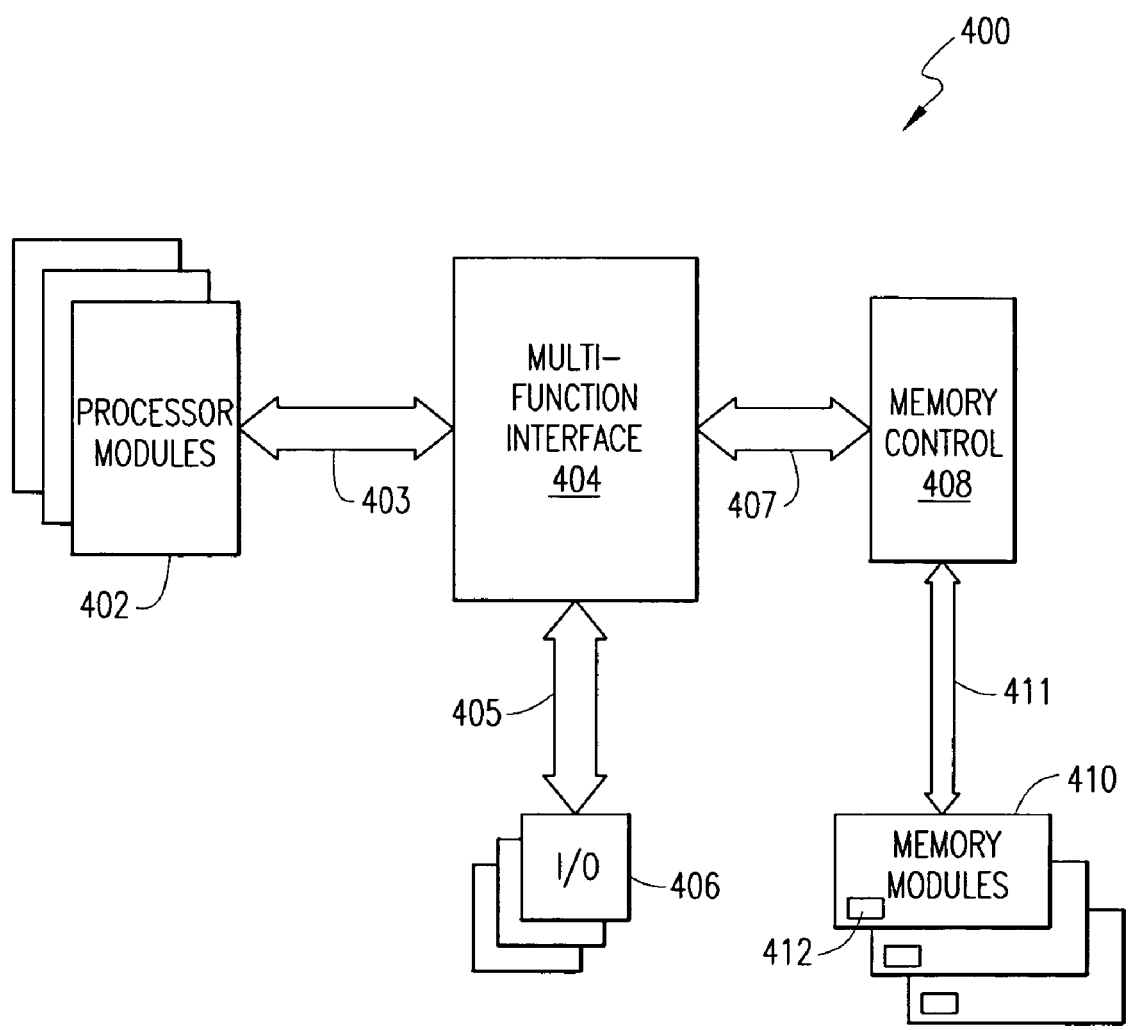
FIG. 4 is an exemplary computer system according to one embodiment.

FIG. 4 is an exemplary computer system 400 according to one embodiment. One or more processor modules 402 are coupled to a multi-function interface 404 via a processor bus 403. A plurality of input/output (I/O) control modules 406 and a memory control block 408 are also coupled to the multi-function interface 404 via suitable bus arrangements 405 and 407. A number of memory modules 410 are coupled to the memory control block 408 via a memory link 411, wherein each memory module 410 is provided with a local voltage regulator 412 for supporting local voltage conversion in accordance with the teachings set forth hereinabove. Although not shown in FIG. 4, one or more voltage sources are operable to supply voltage to the local voltage regulators 412 of the memory modules 410. It should be appreciated by one skilled in the art that the computer system 400 may be architected in any number of ways depending on the number of processors, type and technology of processors, memory and I/O architectures, bus topologies, et cetera. For example, where multiple processors are involved, the computer system 400 may be configured as a multi-cellular system, each cell having its own processors, I/O control, memory control and associated memory modules.

Based on the foregoing Detailed Description, it should be appreciated that an implementation of the embodiments described herein thus provides a technology-independent voltage distribution scheme for memory devices wherein system board power supply and associated voltage plane(s) are eliminated. Accordingly, power supply design's complexity as well as the cost of memory-specific power distribution are reduced. Cost savings may include, for example, elimination of system-board-specific power supply or regulator output, associated bypass capacitor arrangements, heavy etch or power planes. Also, under the technology-independent voltage distribution scheme disclosed herein, cost of memory power regulation scales with populated memory devices, rather than being pre-provisioned for maximum memory capacity as is typically the case in existing systems. Additionally, one or more of the following advantages may be realized in an exemplary voltage distribution embodiment: provision of tighter, lower inductance regulation which decreases voltage variability and increases timing margins; reduction in the pin count on DIMM connector to system board or memory riser card (whereby a smaller connector or wider pin spacing may be accommodated); improved signal integrity due to reduced crosstalk on the same size connector; and reservation of extra pins for implementing additional standard or proprietary functions.

Because voltage-independent embodiments disclosed herein can provide upgradeability and extensibility without changing system board power distribution, transitioning to newer DRAM technologies (e.g., at lower operating voltages) is more cost-effective as well as simpler to implement. Further, the embodiments are amenable to dual +12V power supply rail implementations so that industry-standard form factors can be advantageously accommodated.

Although the invention has been described with reference to certain exemplary embodiments, it is to be understood that the forms of the invention shown and described are to be treated as illustrative only. Accordingly, various changes, substitutions and modifications can be realized without departing from the scope of the present invention as set forth in the following claims.

What is claimed is:

1. A memory board assembly, comprising:
   a plurality of memory devices, each receiving a first voltage path;
   a buffer for buffering data in at least a portion of said plurality of memory devices, said buffer receiving a second voltage path and a bidirectional memory controller path;
   a first voltage regulator module for converting a first externally supplied voltage level into first and second voltage levels that power said first and second voltage paths, respectively;
   a second voltage regulator module for converting a second externally supplied voltage level into said first and second voltage levels; and
   a voltage selection logic block operable to select an output from one of said first voltage regulator module and said second voltage regulator module to supply said first and second voltage levels.

2. The memory board assembly as recited in claim 1, wherein each of said plurality of memory devices comprises a Double Data Rate (DDR) dynamic random access memory (DRAM) device.

3. The memory board assembly as recited in claim 1, wherein at least one of said first and second externally supplied voltage levels is provided by an unregulated voltage source.

4. The memory board assembly as recited in claim 1, wherein at least one of said first and second externally supplied voltage levels comprises approximately about 12V.

5. The memory board assembly as recited in claim 1, wherein said buffer is provided with an interface for coupling with a buffer of another memory board assembly.

6. The memory board assembly as recited in claim 1, wherein said at least one of said first and second voltage regulator modules is comprised of a high-frequency switching voltage converter.

7. The memory board assembly as recited in claim 1, wherein said first voltage path is powered by a $V_{dd}$ voltage level comprising approximately about 0.5V to 3.5V.

8. The memory board assembly as recited in claim 1, wherein said second voltage path is powered by a $V_{cc}$ voltage level comprising approximately about 0.5V to 3.5V.

9. The memory board assembly as recited in claim 1, wherein said plurality of memory devices comprises eight DRAM devices.

10. A voltage distribution method for a memory board assembly, comprising:
    receiving a first external voltage at said memory board assembly through a first voltage supply path;
    locally converting said first external voltage using a first on-board voltage regulator module to generate appropriate local voltage levels for powering a plurality of memory devices of said memory board assembly;
    receiving a second external voltage at said memory board assembly through a second voltage supply path;
    locally converting said second external voltage using a second on-board voltage regulator module to generate said appropriate local voltage levels; and
    selecting an output from one of said first and second on-board voltage regulators to power said plurality of memory devices.

11. The voltage distribution method for a memory board assembly as recited in claim 10, wherein said first external voltage is converted to a first voltage level for powering said plurality of memory devices, each of which comprises a dynamic random access memory (DRAM) device.

12. The voltage distribution method for a memory board assembly as recited in claim 11, wherein said first voltage level comprises approximately about 0.5V to 3.5V.

13. The voltage distribution method for a memory board assembly as recited in claim 10, wherein said first external voltage is received from an unregulated voltage source.

14. The voltage distribution method for a memory board assembly as recited in claim 10, wherein said first external voltage comprises approximately about 12V.

15. The voltage distribution method for a memory board assembly as recited in claim 10, wherein said first external voltage is converted to a second voltage level for powering a buffer operable to buffer data in at least a portion of said plurality of memory devices.

16. The voltage distribution method for a memory board assembly as recited in claim 15, wherein said second voltage level comprises approximately about 0.5V to 3.5V.

17. The voltage distribution method for a memory board assembly as recited in claim 10, wherein said first external voltage is converted by said first on-board voltage regulator module comprised of a high-frequency switching voltage converter.

18. The voltage distribution method for a memory board assembly as recited in claim 10, wherein said plurality of memory devices comprises eight DRAM devices.

19. A computer system, comprising:
at least one processor module coupled to a multi-function interface;
a plurality of input/output (I/O) modules coupled to said multi-function interface for effectuating I/O operations; and
a plurality of memory modules coupled to a memory control block that is interfaced to said multi-function interface, wherein each memory module includes a first local voltage regulator module for converting a first externally supplied voltage level into appropriate local voltage levels for powering at least one memory device thereof, a second local voltage regulator module for converting a second externally supplied voltage level into said appropriate local voltage levels and a voltage selection logic block operable to select an output from one of said first and second local voltage regulator modules to power said local voltage levels.

20. The computer system as recited in claim 19, wherein said at least one memory device comprises a Double Data Rate (DDR) dynamic random access memory (DRAM) device.

21. The computer system as recited in claim 19, wherein at least one of said first and second externally supplied voltage levels is provided by an unregulated voltage source.

22. The computer system as recited in claim 19, wherein at least one of said first and second externally supplied voltage levels comprises approximately about 12V.

23. The computer system as recited in claim 19, wherein each of said plurality of memory modules comprises a fully-buffered Dual In-line Memory Module (DIMM).

24. The computer system as recited in claim 19, wherein at least one of said first and second local voltage regulator modules is comprised of a high-frequency switching voltage converter.

25. The computer system as recited in claim 19, wherein said first and second local voltage regulator modules are respectively operable to convert said first and second externally supplied voltage levels to a first local voltage level comprising approximately about 0.5V to 3.5V.

26. The computer system as recited in claim 19, wherein said first and second local voltage regulator modules are each further operable to convert said first and second externally supplied voltage levels to a second local voltage level comprising approximately about 0.5V to 3.5V.

27. The computer system as recited in claim 19, wherein each of said plurality of memory modules comprises eight DRAM devices.

28. A voltage distribution system for a memory board assembly, comprising:
means for receiving a first voltage at said memory board assembly from a first external source;
means for locally converting said first voltage to generate appropriate local voltage levels for powering a plurality of memory devices of said memory board assembly;
means for receiving a second voltage at said memory board assembly from a second external source;
means for locally converting said second voltage to generate said appropriate local voltage levels; and
means for selecting an output from one of said means for converting said first voltage and said means for converting said second voltage to power said plurality of memory devices.

29. The voltage distribution system for a memory board assembly as recited in claim 28, wherein said means for locally converting said first voltage comprises at least one on-board voltage regulator module.

30. The voltage distribution system for a memory board assembly as recited in claim 28, wherein said means for locally converting said first voltage is operable to convert said first voltage to a first voltage level for powering said plurality of memory devices, each of which comprises a dynamic random access memory (DRAM) device.

31. The voltage distribution system for a memory board assembly as recited in claim 30, wherein said first voltage level comprises approximately about 0.5V to 3.5V.

32. The voltage distribution system for a memory board assembly as recited in claim 28, wherein said first voltage from said first external source comprises approximately about 12V.

33. The voltage distribution system for a memory board assembly as recited in claim 28, wherein said means for locally converting said first voltage is operable to convert said first voltage to a second voltage level for powering a buffer operable to buffer data in at least a portion of said plurality of memory devices.

34. The voltage distribution system for a memory board assembly as recited in claim 33, wherein said second voltage level comprises approximately about 0.5V to 3.5V.

35. The voltage distribution system for a memory board assembly as recited in claim 28, wherein said plurality of memory devices comprises eight Double Data rate (DDR) DRAM devices.

* * * * *